United States Patent
Oh et al.

(10) Patent No.: US 9,876,190 B2
(45) Date of Patent: Jan. 23, 2018

(54) ORGANIC LIGHT-EMITTING DIODE AND METHOD FOR MANUFACTURING SAME

(71) Applicant: LG DISPLAY CO., LTD., Seoul (KR)

(72) Inventors: Ducksu Oh, Daejeon (KR); Minsoo Kang, Daejeon (KR); Sung Ho Mo, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/891,280

(22) PCT Filed: Aug. 21, 2014

(86) PCT No.: PCT/KR2014/007795
§ 371 (c)(1),
(2) Date: Nov. 13, 2015

(87) PCT Pub. No.: WO2015/026185
PCT Pub. Date: Feb. 26, 2015

(65) Prior Publication Data
US 2016/0087237 A1    Mar. 24, 2016

(30) Foreign Application Priority Data
Aug. 21, 2013  (KR) .................. 10-2013-0099236

(51) Int. Cl.
*H01L 51/52* (2006.01)
*H01L 27/32* (2006.01)
(Continued)

(52) U.S. Cl.
CPC ........ *H01L 51/524* (2013.01); *H01L 27/3276* (2013.01); *H01L 51/004* (2013.01);
(Continued)

(58) Field of Classification Search
CPC ... H01L 51/524; H01L 51/56; H01L 51/0023; H01L 27/3276; H01L 51/004;
(Continued)

(56) References Cited

U.S. PATENT DOCUMENTS 5,990,615 A    11/1999  Sakaguchi et al.
2005/0023965 A1    2/2005  Maeda et al.
(Continued)

FOREIGN PATENT DOCUMENTS

CN    102420239 A    4/2012
EP    2144290 A1    1/2010
(Continued)

*Primary Examiner* — Fernando L Toledo
*Assistant Examiner* — Adam S Bowen
(74) *Attorney, Agent, or Firm* — Dentons US LLP

(57) ABSTRACT

Provided are an organic light emitting diode and a method for preparing the same. In more detail, the organic light emitting diode includes a substrate; organic light emitting unit in which a first electrode, an organic material layer, and a second electrode are sequentially laminated on the substrate; and an encapsulation unit encapsulating an outside of the organic light emitting unit, in which the encapsulation unit includes a sealing layer contacting the outside of the organic light emitting unit, an insulating layer provided on the sealing layer, and a metal pattern layer provided between the sealing layer and the insulating layer.

24 Claims, 5 Drawing Sheets

(51) Int. Cl.
*H01L 51/00* (2006.01)
*H01L 51/56* (2006.01)

(52) U.S. Cl.
CPC ...... *H01L 51/0023* (2013.01); *H01L 51/0097* (2013.01); *H01L 51/5203* (2013.01); *H01L 51/5243* (2013.01); *H01L 51/56* (2013.01); *H01L 2251/5338* (2013.01); *H01L 2251/5392* (2013.01); *H01L 2251/558* (2013.01); *H01L 2251/566* (2013.01)

(58) Field of Classification Search
CPC ............. H01L 51/0097; H01L 51/5243; H01L 51/5203; H01L 2251/558; H01L 2251/5392; H01L 2251/5338; H01L 2251/566
USPC .......................................................... 257/40
See application file for complete search history.

(56) References Cited

U.S. PATENT DOCUMENTS

| | | | |
|---|---|---|---|
| 2007/0090759 A1 | 4/2007 | Choi et al. | |
| 2007/0176185 A1 | 8/2007 | Lee et al. | |
| 2008/0087902 A1* | 4/2008 | Lee | H01L 27/153 257/88 |
| 2008/0265754 A1 | 10/2008 | Young et al. | |
| 2009/0276635 A1 | 11/2009 | Baggen et al. | |
| 2010/0294526 A1 | 11/2010 | Farquhar et al. | |
| 2011/0315977 A1 | 12/2011 | Murayama et al. | |
| 2012/0075261 A1 | 3/2012 | Ryu et al. | |
| 2012/0153814 A1 | 6/2012 | Lee et al. | |
| 2012/0326131 A1* | 12/2012 | Han | H01L 51/5215 257/40 |
| 2013/0112962 A1* | 5/2013 | Lee | H01L 51/5212 257/40 |
| 2013/0207093 A1* | 8/2013 | Jeong | H01L 51/5243 257/40 |
| 2013/0334517 A1 | 12/2013 | Hong et al. | |
| 2014/0191223 A1 | 7/2014 | Wada et al. | |
| 2015/0311469 A1 | 10/2015 | Lee et al. | |
| 2016/0268309 A1 | 9/2016 | Yamazaki et al. | |

FOREIGN PATENT DOCUMENTS

| | | |
|---|---|---|
| JP | 9-1095 A | 1/1997 |
| JP | 2003086362 A | 3/2003 |
| JP | 2005050697 A | 2/2005 |
| JP | 2005338419 A | 12/2005 |
| JP | 2006331695 A | 12/2006 |
| JP | 2007073225 A | 3/2007 |
| JP | 2008523537 A | 7/2008 |
| JP | 2008530752 A | 8/2008 |
| JP | 2011171128 A | 9/2011 |
| JP | 2012133302 A | 7/2012 |
| JP | 5112707 B2 | 10/2012 |
| JP | 2013531345 A | 8/2013 |
| JP | 5703394 B2 | 4/2015 |
| KR | 19980071030 A | 10/1998 |
| KR | 1020060087620 A | 8/2006 |
| KR | 1020120004943 A | 1/2012 |
| KR | 1020120005414 A | 1/2012 |
| TW | 465122 B | 11/2001 |
| TW | 200718269 B | 11/2010 |
| TW | 200737562 B | 5/2011 |
| TW | 201214699 A | 4/2012 |
| TW | 201321329 A | 6/2013 |
| WO | 2006087653 A2 | 8/2006 |
| WO | 2010106637 A1 | 9/2010 |
| WO | 2010106853 A1 | 9/2010 |
| WO | 2011114882 A1 | 9/2011 |
| WO | 2012005526 A2 | 1/2012 |
| WO | 2013042533 A1 | 3/2013 |

\* cited by examiner

[Figure 1]
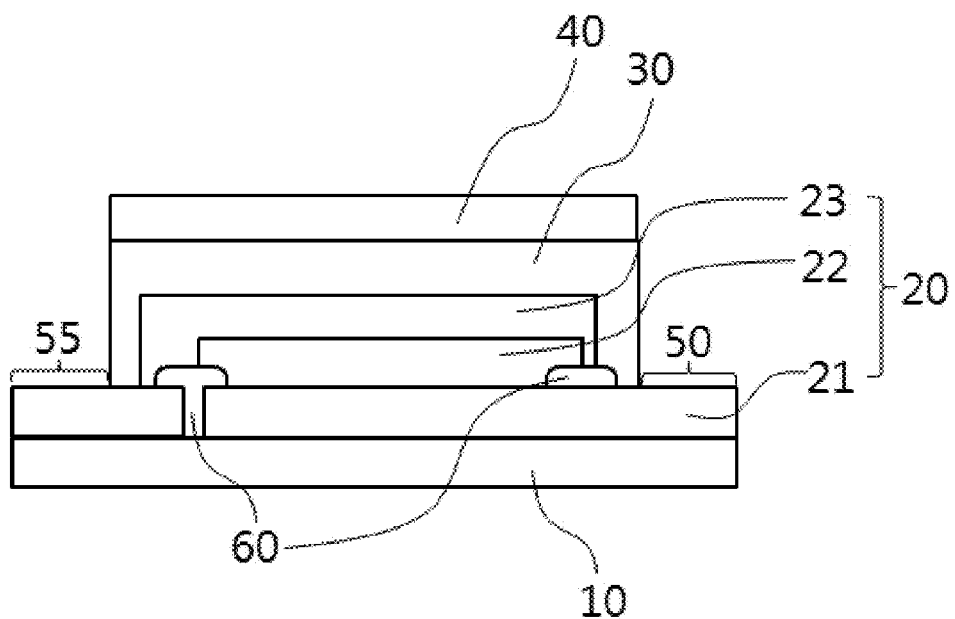
[Figure 2]
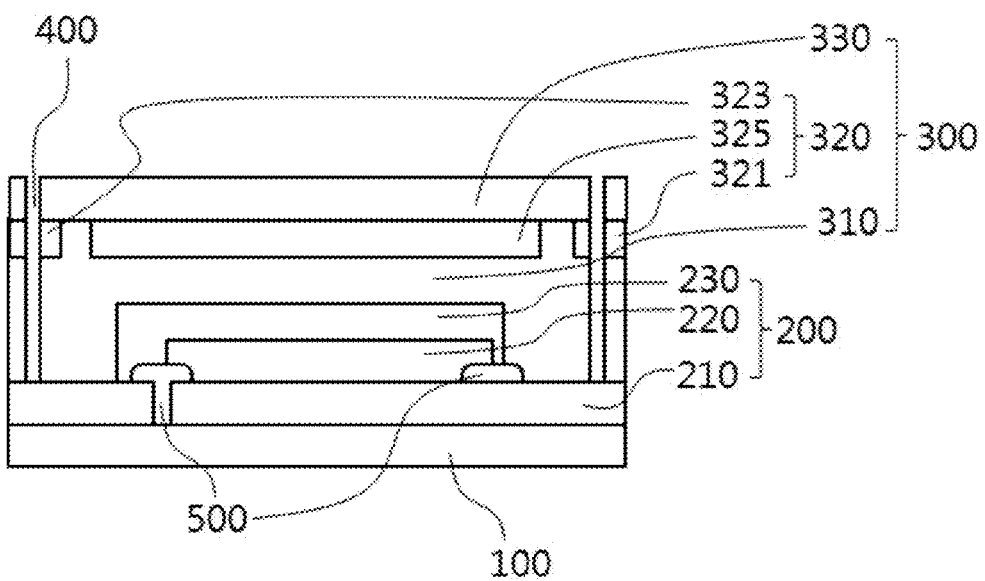

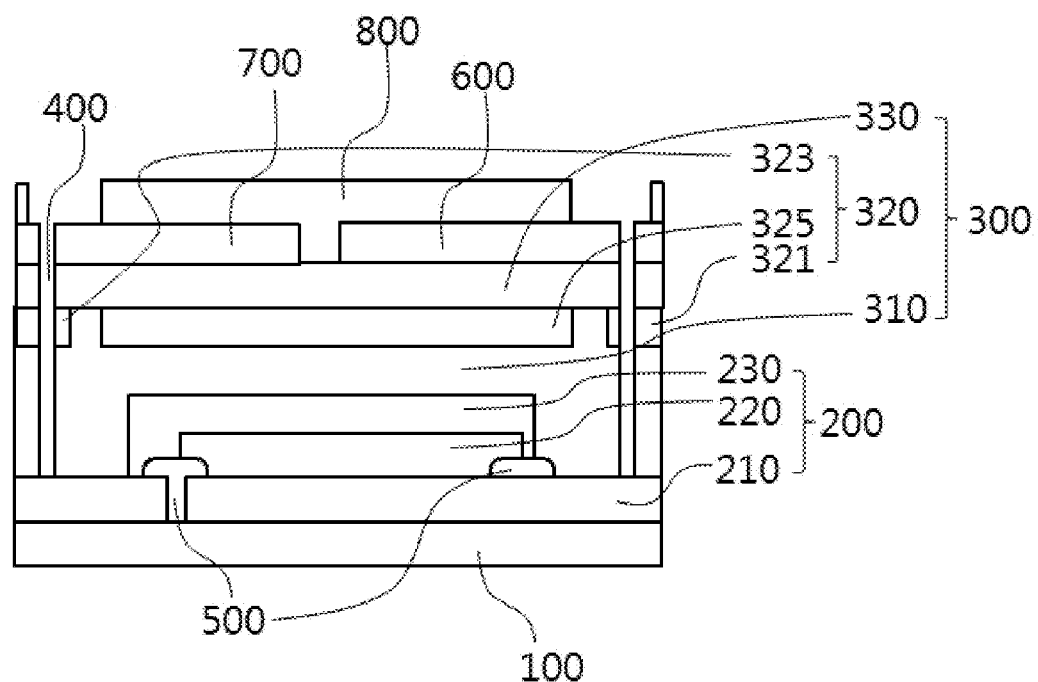
[Figure 3]

[Figure 4]
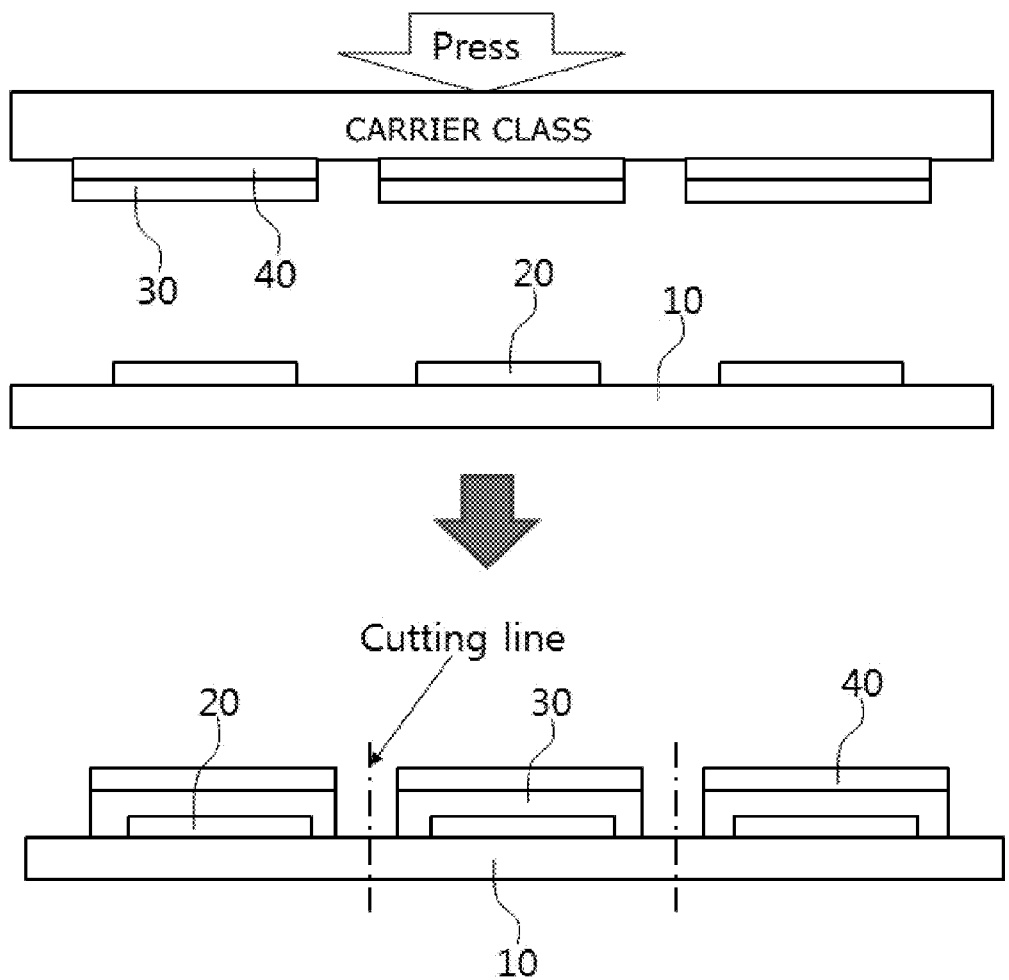

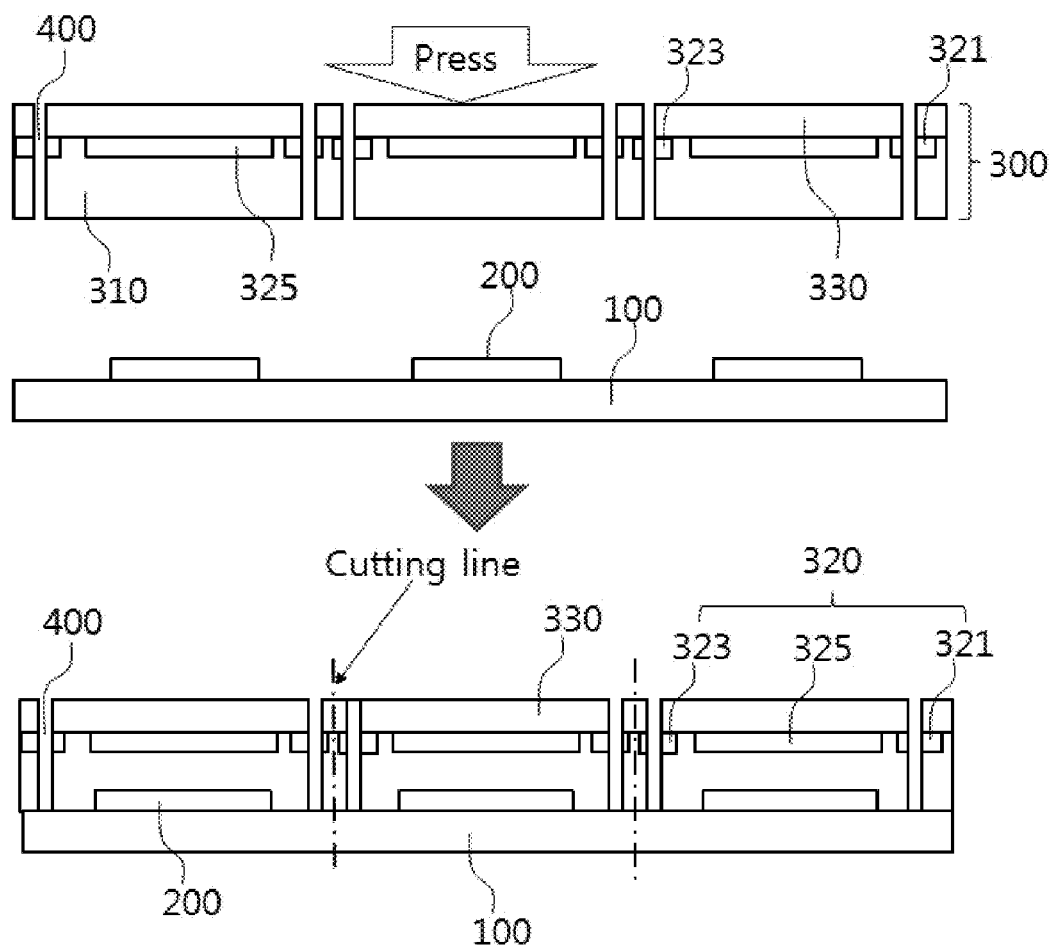

[Figure 6]
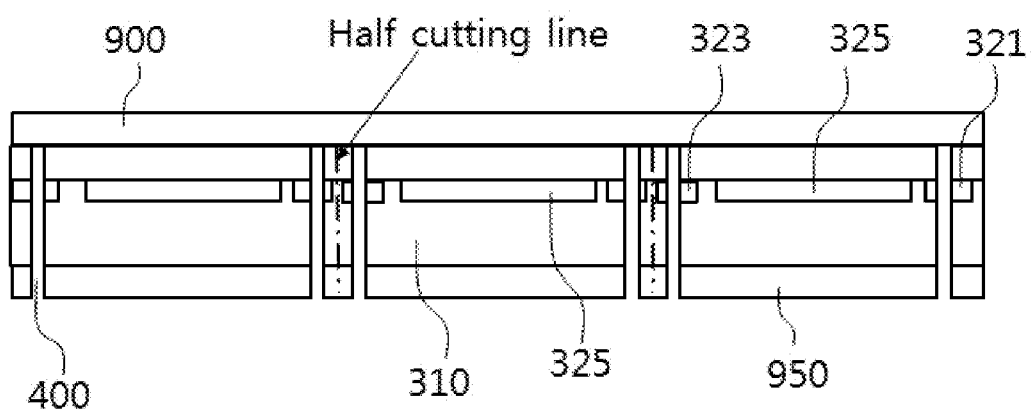

ORGANIC LIGHT-EMITTING DIODE AND METHOD FOR MANUFACTURING SAME

TECHNICAL FIELD

This application is a National Stage Application of International Application No. PCT/KR2014/007795, filed Aug. 21, 2014, and claims priority to and the benefit of Korean Patent Application No. 10-2013-0099236, filed on Aug. 21, 2013, the contents of each which is incorporated by reference in its entirety for all purposes as if fully set forth below.

The present invention relates to an organic light emitting diode and a method for preparing the same.

BACKGROUND ART

An organic light emitting diode is a device that emits light while holes and electrons are injected into a light emitting layer formed between electrodes through the electrodes and the injected holes and electrons generate excitons to be dissipated.

Since the organic light emitting diode has a self-emission characteristic, as compared with a liquid crystal display in the related art, the organic light emitting diode has advantages of having a small thickness, low power consumption, an excellent viewing angle, and a high response speed. Further, as compared with a plasma display panel or an inorganic EL panel display, the organic light emitting diode has advantages of having low power consumption and excellent color sense because the organic light emitting diode can be driven at a low voltage of 10 V or less. In addition, the organic light emitting diode may be prepared by using a plastic substrate having a bending characteristic.

Further, the organic light emitting diode is divided into a passive type and an active type. In the passive type, a bottom emission type in which light generated from the light emitting layer is emitted onto a substrate surface has been adopted. On the contrary, in the active type, when the bottom emission type is adopted, the organic light emitting diode is covered by a TFT, and as a result, an aperture ratio is lowered. Accordingly, in order to increase the aperture ratio, a top emission type in which light is emitted to an opposite side of the substrate has been required.

In the related art, an encapsulation method and an encapsulation structure of the organic light emitting diode having such an excellent advantage are generally to encapsulate a substrate where a light emitting element constituted by a first electrode, a second electrode, and a light emitting layer is positioned and an encapsulation cap encapsulating the substrate by using a thermosetting or photo-curable adhesive member.

DISCLOSURE

Technical Problem

In the art, researches for an organic light emitting diode having an excellent encapsulation characteristic are required.

Technical Solution

An exemplary embodiment of the present invention provides an organic light emitting diode including: a substrate; an organic light emitting unit in which a first electrode, an organic material layer, and a second electrode are sequentially laminated on the substrate; and an encapsulation unit encapsulating an outside of the organic light emitting unit, in which the encapsulation unit includes a sealing layer contacting the outside of the organic light emitting unit, an insulating layer provided on the sealing layer, and a metal pattern layer provided between the sealing layer and the insulating layer, and the metal pattern layer includes a first metal pattern which electrically connects the first electrode and an external power supply and a second metal pattern which electrically connects the second electrode and the external power supply.

Further, another exemplary embodiment of the present invention provides an illumination device including the organic light emitting diode.

Further, yet another exemplary embodiment of the present invention provides a display device including the organic light emitting diode.

Still another exemplary embodiment of the present invention provides a method for preparing an organic light emitting diode including: forming an organic light emitting unit including a first electrode, an organic material layer, and a second electrode on a substrate in sequence; and encapsulating an outside of the organic light emitting unit by an encapsulation unit including a sealing layer contacting the outside of the organic light emitting unit, an insulating layer provided on the sealing layer, and a metal pattern layer provided between the sealing layer and the insulating layer, in which the metal pattern layer includes a first metal pattern which electrically connects the first electrode and an external power supply and a second metal pattern which electrically connects the second electrode and the external power supply.

Still yet another exemplary embodiment of the present invention provides a method for preparing an organic light emitting diode including: forming two or more organic light emitting units including a first electrode, an organic material layer, and a second electrode on one substrate; forming two or more organic light emitting diodes including a substrate, an organic light emitting unit, and an encapsulation unit by simultaneously encapsulating the outsides of the two or more organic light emitting units by the encapsulation unit; and dividing the two or more organic light emitting diodes into individual organic light emitting diodes, in which the encapsulation unit includes a sealing layer contacting the outside of each of the two or more organic light emitting units; an insulating layer provided on the sealing layer; and a metal pattern layer provided between the sealing layer and the insulating layer and including a first metal pattern which electrically connects the first electrode and an external power supply and a second metal pattern which electrically connects the second electrode and the external power supply.

Still yet another exemplary embodiment of the present invention provides an encapsulation member including: a sealing layer, an insulating layer provided on the sealing layer, and a metal pattern layer provided between the sealing layer and the insulating layer, in which the encapsulation member includes at least one contact hole penetrating in a thickness direction, the encapsulation member includes a protective layer on at least one of an upper surface and a lower surface of the encapsulation member, and the metal pattern layer includes two or more metal patterns which are spaced apart from each other to be electrically short-circuited from each other.

Still another exemplary embodiment of the present invention provides an encapsulation member including: a sealing layer, an insulating layer provided on the sealing layer, and a metal pattern layer provided between the sealing layer and the insulating layer, in which the encapsulation member includes protective layers on an upper surface and a lower surface of the encapsulation member, any one of the protective layers provided on the upper surface and the lower surface of the encapsulation member, the insulating layer, the metal pattern layer, and the sealing layer are half-cut in a thickness direction, and the metal pattern layer includes two or more metal patterns which are spaced apart from each other to be electrically short-circuited from each other.

Still another exemplary embodiment of the present invention provides a method for preparing an encapsulation member including: forming a first protective layer on one surface of an insulating layer and forming a metal pattern layer including two or more metal patterns which are spaced apart from each other to be electrically short-circuited from each other, on the other surface of the insulating layer; forming a sealing layer on the entire surface of the insulating layer and the metal pattern layer; forming a second protective layer on the sealing layer; and forming at least one contact hole penetrating in a thickness direction of the insulating layer, the metal pattern layer, the sealing layer, and the second protective layer.

Advantageous Effects

According to the exemplary embodiment of the present invention, the organic light emitting diode uses a structure including a sealing layer, an insulating layer, and a metal pattern layer between the sealing layer and the insulating layer as an encapsulation unit, and as a result, a structure for encapsulation of the organic light emitting unit and an equipotential of the electrode may be simplified.

DESCRIPTION OF DRAWINGS

FIG. 1 is a diagram schematically illustrating an organic light emitting diode in the related art.

FIGS. 2 and 3 are diagrams schematically illustrating an organic light emitting diode according to an exemplary embodiment of the present invention.

FIG. 4 is a diagram schematically illustrating a method for preparing an organic light emitting diode in the related art.

FIG. 5 is a diagram schematically illustrating a method for preparing an organic light emitting diode according to another exemplary embodiment of the present invention.

FIG. 6 is a diagram schematically illustrating an encapsulation member according to an exemplary embodiment of the present invention.

EXPLANATION OF REFERENCE NUMERALS

10: Substrate
20: Organic light emitting unit
21: First electrode
22: Organic material layer
23: Second electrode
30: Sealing layer
40: Encapsulation plate
50: First electrode pad
55: Second electrode pad
60: Insulating part
100: Substrate
200: Organic light emitting unit
210: First electrode
220: Organic material layer
230: Second electrode
300: Encapsulation unit
310: Sealing layer
320: Metal pattern layer
321: First metal pattern
323: Second metal pattern
325: Third metal pattern
330: Insulating layer
400: Contact hole
500: Insulating part
600: First metal pad
700: Second metal pad
800: Additional insulating layer
900: First protective layer
950: Second protective layer

MODE FOR INVENTION

Hereinafter, exemplary embodiments of the present invention will be described in detail.

Among organic light emitting diode (OLED) techniques, an encapsulation process is a core technique determining a lifespan of the OLED and reliability, and an OLED material may cause various problems such as induction of deformation and deterioration of the lifespan of the organic material layer and the electrodes when moisture or oxygen penetrates, due to a characteristic in which the OLED material is very vulnerable to moisture and oxygen. Accordingly, in the OLED, the encapsulation process for blocking external air is absolutely required.

The organic light emitting diode and the method for preparing the same in the related art are schematically illustrated in FIGS. 1 and 4. In the organic light emitting diode in the related art, a method of cutting a sealing layer 30 and laminating the sealing layer 30 on the organic light emitting diode by using a carrier is used in order to expose electrode pad ends 50 and 55. However, in the method, it is difficult to cut the sealing layer and use the carrier. Further, in the exposed first electrode pad 50 and second electrode pad 55, a configuration for electrically connecting each of the electrode pads to an external power supply is further required, and a process for the connection is further required.

In the present invention, by applying a flexible printed circuit board (FPCB) where a metal pattern and a contact hole are provided on the insulating layer and a face seal film, even in the case of manufacturing a plurality of organic light emitting diodes on one large substrate, the cutting of the sealing layer and the like is not required and the use of the carrier may be excluded. As a result, the present invention provides the organic light emitting diode and the method for manufacturing the same having the advantages on the process.

The organic light emitting diode according to an exemplary embodiment of the present invention includes a substrate; an organic light emitting unit in which a first electrode, an organic material layer, and a second electrode are sequentially laminated on the substrate; and an encapsulation unit encapsulating an outside of the organic light emitting unit, in which the encapsulation unit includes a sealing layer contacting the outside of the organic light emitting unit, an insulating layer provided on the sealing layer, and a metal pattern layer provided between the sealing layer and the insulating layer.

In the present invention, the metal pattern layer may serve as a barrier that prevents external moisture, air, or the like from penetrating into the inside of the organic light emitting unit.

In the present invention, the first electrode or the second electrode may be electrically connected with an external power supply through the metal pattern layer. In more detail, the metal pattern layer may include a first metal pattern which electrically connects the first electrode and the external power supply, and the metal pattern layer may include a second metal pattern which electrically connects the second electrode and the external power supply. Further, in the present invention, the metal pattern layer may include both the first metal pattern and the second metal pattern.

In the present invention, the metal pattern layer includes a third metal pattern, and the third metal pattern may be provided on an emission area of the organic light emitting unit. That is, in the present invention, the metal pattern layer includes the first metal pattern, the second metal pattern, and the third metal pattern, the first metal pattern electrically connects the first electrode and the external power supply, the second metal pattern electrically connects the second electrode and the external power supply, the third metal pattern is provided on an emission area of the organic light emitting unit, and the first metal pattern, the second metal pattern, and the third metal pattern may be spaced apart from each other to be electrically short-circuited from each other.

Based on an upper plan view of the organic light emitting diode, the area of the third metal pattern may be the same as or larger than that of the emission area of the organic light emitting unit. Further, the third metal pattern may have a structure of sealing the upper portion and the side of the emission area of the organic light emitting unit. In detail, the third metal pattern may serve as a barrier that prevents external moisture, air, or the like from penetrating into the inside of the organic light emitting unit.

The metal pattern layer may be formed by laminating a pre-cut metal pattern on the insulating layer or depositing the metal layer on the insulating layer and then patterning.

The thickness of the metal pattern layer may be 1 μm to 50 μm. Specifically, the thickness of the metal pattern layer may be 5 μm to 20 μm, but is not limited thereto.

In the present invention, when two or more organic light emitting diodes are prepared, the encapsulating that encapsulating the outside of the organic light emitting unit may be formed in one process by using two or more metal pattern layers formed on one insulating layer. Accordingly, two or more organic light emitting diodes may be prepared in a continuous process, and a flexible organic light emitting diode may be prepared by a roll-to-roll process by using a plastic substrate as the substrate in a simple process.

Further, two or more organic light emitting units are provided on the substrate, and in the encapsulation unit, two or more metal pattern layers are provided on one insulating layer, and as a result, a large-area organic light emitting diode may be manufactured in a simple process by the aforementioned process.

Further, each of the two or more metal pattern layers includes the first metal pattern, the second metal pattern, and the third metal pattern as described above, and may have a structure in which the metal patterns may be spaced apart from each other to be electrically short-circuited from each other. In this case, the first metal pattern may electrically connect the first electrode and the external power supply, the second metal pattern may electrically connect the second electrode and the external power supply, and the third metal pattern may be provided on an emission area of the organic light emitting unit.

In the present invention, the encapsulation unit may include a contact hole that electrically connects the first electrode or the second electrode with the external power supply. The contact hole may be formed by using a method which is known in the art. The contact hole is formed in a thickness direction of the encapsulation unit. The contact hole penetrates up to a first electrode pad which is connected with the first electrode of the organic light emitting unit and extended to a non-emission unit of the substrate where the organic light emitting unit is formed, and a second electrode pad which is connected with the second electrode of the organic light emitting unit and extended to the non-emission unit of the substrate where the organic light emitting unit is formed.

A size of a vertical section in a length direction of the contact hole is defined by sizes of the first electrode pad and the second electrode pad, and in detail, the area of the vertical section in the length direction of the contact hole is smaller than or the same as the areas of the first electrode pad and the second electrode pad. Preferably, the area of the vertical section in the length direction of the contact hole may be almost the same as or similar to the areas of the first electrode pad and the second electrode pad.

The contact hole may be filled with a conductive material for electrically connecting the first electrode or the second electrode with the external power supply. The conductive material may be any one of a conductive paste including one or more kinds selected from Ag, Au, Cu, Ni, Al, W, Co, Pd, and an alloy thereof; a conductive polymer including one or more kinds selected from polyacetylene, polyaniline, doped polyethylene, polypyrrole, polythiophene, conductive epoxy, a mixture thereof, and a copolymer thereof; and a mixture made by adding a conductive ball to the conductive polymer, but is not limited thereto.

In the present invention, the sealing layer may include a conductive ball. The conductive ball may serve to electrically connect the first electrode or the second electrode with the external power supply. In this case, the conductive ball may be included to be disposed in a groove portion of a pattern by forming the pattern on the sealing layer so as to electrically connect the first electrode or the second electrode with the external power supply.

In the present invention, a first metal pad which is provided on an opposite surface to the surface with the metal pattern layer of the insulating layer and electrically connected with the first electrode may be further included. Further, a second metal pad which is provided on the opposite surface to the surface with the metal pattern layer of the insulating layer and electrically connected with the second electrode may be further included. Further, both the first metal pad and the second metal pad which are provided on the opposite surface to the surface with the metal pattern layer of the insulating layer may be included. Further, an additional insulating layer may be provided between the first metal pad and the second metal pad.

The organic light emitting diode according to the exemplary embodiment of the present invention will be schematically illustrated in FIGS. 2 and 3. FIG. 2 schematically illustrates a structure of the organic light emitting diode in which a metal pattern layer 320 is provided on one side of an insulating layer 330 as encapsulation unit 300. FIG. 3 schematically illustrates a structure of the organic light emitting diode in which a metal pattern layer 320 is provided on one side of the insulating layer 330 as the encapsulation unit 300 and a first metal pad 600 and a second metal pad 700 are provided on the other side.

In the present invention, the substrate may be a transparent substrate, and in more detail, the substrate may be an organic substrate or a plastic substrate, but is not limited thereto.

In the present invention, the insulating layer may include one or more of polyacrylate, polypropylene (PP), polyethylene terephthalate (PET), polyethylene ether phthalate, polyethylene phthalate, polybutylene phthalate, polyethylene naphthalate (PEN), polycarbonate (PC), polystyrene (PS), polyether imide, polyether sulfone, polydimethyl siloxane (PDMS), polyetheretherketone (PEEK), and polyimide (PI), but is not limited thereto. In detail, the insulating layer may include polyimide.

The thickness of the insulating layer may be 1 µm to 50 µm. Specifically, the thickness of the insulating layer may be 5 µm to 20 µm, but is not limited thereto.

In the present invention, the sealing layer may use a face seal film. The face seal film may be an adhesive film including a getter. The getter is a material that absorbs residual gas or makes a compound with the gas. A kind of getter is not limited if the getter is included on the adhesive film to absorb residual moisture or oxygen or make a compound by reacting with the residual moisture or oxygen. For example, the getter may be at least one of activated carbon, barium, magnesium, zirconium, and red phosphorus.

In the present invention, the metal pattern layer may include one or more kinds of copper, aluminum, iron, magnesium, calcium, sodium, potassium, titanium, indium, yttrium, lithium, gadolinium, platinum, gold, tungsten, tantalum, silver, tin, lead, and the like, but is not limited thereto.

In the present invention, the organic light emitting unit may include an anode, one or more organic material layers, and a cathode.

The anode may be formed with one or more kinds selected from magnesium, calcium, sodium, potassium, titanium, indium, yttrium, lithium, gadolinium, aluminum, platinum, gold, tungsten, tantalum, copper, silver, tin, and lead.

Further, the anode may be formed with a transparent conductive oxide. Here, the transparent conductive oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al), and lanthanum (La).

The anode may be formed by using any one physical vapor deposition (PVD) method selected from a sputtering method, an E-beam evaporation method, a thermal evaporation method, a laser molecular beam epitaxy (L-MBE) method, and a pulsed laser deposition (PLD) method; any one chemical vapor deposition method selected from a thermal chemical vapor deposition method, a plasma-enhanced chemical vapor deposition (PECVD) method, a light chemical vapor deposition method, a laser chemical vapor deposition method, a metal-organic chemical vapor deposition (MOCVD) method, and a hydride vapor phase epitaxy (HYPE) method; or an atomic layer deposition (ALD) method.

For improving a resistance of the anode, an auxiliary electrode may be further included. The auxiliary electrode may be formed with one or more kinds selected from a group consisting of a conductive sealant and a metal by using a deposition process or a printing process. In more detail, the auxiliary electrode may include at least one of Cr, Mo, Al, Cu, and an alloy thereof, but is not limited thereto.

An insulating layer may be further included on an auxiliary electrode. The insulating layer may be formed by using a material and a method which are known in the art. In more detail, the insulating layer may be formed by using a general photoresist material; polyimide; polyacryl; silicon nitride; silicon oxide; aluminum oxide; aluminum nitride; alkaline metal oxides; alkaline earth metal oxide, and the like, but is not limited thereto. The thickness of the insulating layer may be 10 nm to 10 µm, but is not limited thereto.

A detailed material and forming method of the organic material layer are not particularly limited, and may use a material and a forming method which are widely known in the art.

The organic material layer may be prepared with a smaller number of layers by a solvent process other than a deposition method, for example, a method such as spin coating, dip coating, doctor blading, screen printing, ink jet printing, or a heat transfer method by using various polymer materials.

The organic material layer includes a light emitting layer, and may have a laminated structure including at least one selected from a hole injection layer, a hole transport layer, an electron transport layer, and an electron injection layer.

A material that may form the hole injection layer may be a material having a large work function so that the hole injection layer may be smoothly injected into the organic material layer. A detailed example of the hole injection material is a metal such as vanadium, chromium, copper, zinc, and gold or an alloy thereof; a metal oxide such as zinc oxide, indium oxide, indium tin oxide (ITO), or indium zinc oxide (IZO); a combination of metal and oxides such as ZnO:Al or $SnO_2$:Sb; a conductive polymer such as poly(3-methyl thiophene), poly[3,4-(ethylene-1,2-dioxy)thiophene] (PEDT), polypyrrole, or polyaniline, but is not limited thereto.

A material which may form the electron injection layer may be generally a material having a small work function so that the electrons are easily injected into the organic material layer. A detailed example of the electron injection material may include a metal such as magnesium, calcium, sodium, potassium, titanium, indium, yttrium, lithium, gadolinium, aluminum, silver, tin, and lead or an alloy thereof; a multilayer structure material such as LiF/Al or $LiO_2$/Al, and use the same material as the hole injection electrode material, but is not limited thereto.

The material may form the light emitting layer may be a material which has good quantum efficiency for fluorescence and phosphorescence, as a material that may emit light in a visible-light area by receiving and coupling the holes and the electrons from the hole transport layer and the electron transport layer. A detailed example of the material is a 8-hydroxquinoline aluminum complex (Alq3); a carbazole-based compound; a dimerized styryl compound; BAlq, a 10-hydroxybenzoquinoline-metal compound; benzoxazole, benzothiazole, and benzimidazole-based compounds; poly (p-phenylen vinylene) (PPV)-based polymers; a spiro compound; polyfluorene, rubrene; phosphorescent host CBP [[4,4'-bis p(9-carbazolyl) biphenyl]; or the like, but is not limited thereto.

Further, in order to improve a fluorescent and phosphorescent property, the light emitting material may further include a phosphorescent dopant or a fluorescent dopant. A detailed example of the phosphorescent dopant includes ir(ppy)(3)(fac tris(2-phenylpyridine) iridium), F2Irpic [iridium(III)bis(4,6-di-fluorophenyl-pyridinato-N,C2) picolinate], or the like. The fluorescent dopant may use materials which are known in the art.

The material which may form the electron transport layer may be a material having large mobility for the electron, as a material which may receive the electrons from the electron injection layer well to carry the received electrons to the light emitting layer. A detailed example includes an Al complex of 8-hydroxyquinoline; a complex including Alq3; an organic radical compound; a hydroxyflavone-metal complex, or the like, but is not limited thereto.

The cathode may include at least one of Al, Ag, Ca, Mg, Au, Mo, Ir, Cr, Ti, Pd, and an alloy thereof, but is not limited thereto.

The organic light emitting diode according to the present invention may be more preferably applied to an organic light emitting diode for illumination. Further, the organic light emitting diode according to the present invention may be more preferably applied to a flexible organic light emitting diode.

In the present invention, a light extraction layer may be further included between the substrate and the first electrode.

The light extraction layer is not particularly limited if the light extraction layer has a structure that may improve internal light extraction efficiency of the device by inducing light scattering. For example, the light extraction layer may include an area of which a refractive index is 1.7 or more, in detail, 1.7 to 3.0. The material of which the refractive index is 1.7 or more is included in the light extraction layer to obtain a light scattering effect due to a difference in refractive index from another area having a relatively low refractive index.

As one example of the present invention, the light extraction layer may have a structure in which scattering particles are dispersed in a binder. The binder may have a higher refractive index than the scattering particles, and light scattering due to the difference in refractive index on an interface between the binder and the scattering particles may be induced. For example, the refractive index of the binder may be 1.7 or more or in a range of 1.7 to 3.0.

As another example, the light extraction layer includes scattering particles and a binder, and a scattering layer with unevenness by the scattering particles and a planarization layer formed on the scattering layer to planarize a surface curve due to the uneven structure of the scattering layer may be included on an opposite surface to a surface contacting the substrate. The light extraction layer increases a difference in refractive index between the scattering particles and the planarization layer to enhance internal light extraction efficiency. The planarization layer may have a higher refractive index than the scattering particles, and for example, the refractive index of the planarization layer may be 1.7 or more, or in a range of 1.7 to 3.0.

As another example, the light extraction layer may include a binder layer formed on the substrate and having an uneven structure; and a planarization layer formed on the binder layer to form a planarization surface. For example, the refractive index of the planarization layer may be 1.7 or more or in a range of 1.7 to 3.0.

The scattering particles may have spherical, ellipsoidal, or amorphous shapes, and preferably, may have spherical or ellipsoidal shapes. An average diameter of the scattering particles may be 100 to 300 nm, and in detail, may be 150 to 200 nm.

The scattering particles are not particularly limited if the scattering particles may scatter the light by using a difference in refractive ratio from the binder to the planarization layer. For example, the scattering particles may be one or more kinds selected from a group consisting of air, silicon, silica, glass, titanium oxide, magnesium fluoride, zirconium oxide, alumina, cerium oxide, hafnium oxide, niobium pentoxide, tantalum pentoxide, indium oxide, tin oxide, indium tin oxide, zinc oxide, silicon, sulfur zinc, calcium carbonate, barium sulfate, silicon nitride, and aluminum nitride. As one example, the scattering particles may be titanium dioxide.

The binder is not particularly limited, and may be an organic binder, an inorganic binder, or an organic and inorganic complex binder. For example, the binder may be an inorganic binder or an organic and inorganic complex binder. Since the inorganic binder or the organic and inorganic complex binder has excellent heat resistance property and chemical resistance property as compared with the organic binder, it is advantageous in performance of the device, particularly, a lifespan, and since the deterioration is not caused even in a high-temperature process at 150° C. or more, a photo process, and an etching process which may be performed in a device preparing process, it is advantageous that various devices are prepared. For example, the binder may be one or more kinds selected from a group consisting of an inorganic binder or organic-inorganic complex binder based on silicon oxide, silicon nitride, silicon oxynitride, alumina, and a siloxane bond (Si—O). For example, an inorganic binder based on the [Si—O] bond by condensation polymerization using siloxane may be formed or an organic-inorganic complex type in which an alkyl group is not completely removed in the siloxane bond may be used.

A component configuring the planarization layer may be selected in the same range as the binder configuring the scattering layer described above. The binder in the scattering layer and the planarization layer may use the same component or different components. Further, the planarization layer may further include a high refractive filler which may enhance the refractive index. The high refractive filler is not particularly limited if the high refractive filler is dispersed in the light extraction layer to enhance the refractive index. For example, the high refractive filler may be one or more kinds selected from a group consisting of alumina, aluminum nitride, zirconium oxide, titanium oxide, cerium oxide, hafnium oxide, niobium pentoxide, tantalum pentoxide, indium oxide, tin oxide, indium tin oxide, zinc oxide, silicon, sulfur zinc, calcium carbonate, barium sulfate, and silicon nitride. As one example, the high refractive filler may be titanium dioxide.

An average particle size of the high refractive filler may be 5 to 30 nm, in detail, 15 to 25 nm. If the particle size of the high refractive filler is excessively small, an effect of enhancing the refractive index is minimal, and reversely, light transmittance may be deteriorated.

Generally, in the organic light emitting diode, internal total reflection occurs due to the difference in refractive index between layers configuring the device, and as a result, the emission efficiency may be deteriorated, and luminance may be decreased. The present invention improves internal light extraction efficiency by forming the light extraction layer including scattering particles on the substrate.

The light extraction layer may be formed only in an emission area of the device as a surface where the device is deposited. Further, the light extraction layer may be encapsulated by the substrate and the anode.

In the organic light emitting diode in the related art, external air (for example, oxygen) or moisture may penetrate into the device through the path where the light extraction layer is formed. Oxygen or moisture flowing into the device is a cause of shortening the lifespan of the device. However, in the present invention, in order to block oxygen and the moisture from flowing due to the formation of the light extraction layer, since the light extraction layer is formed only in the emission area of the device or encapsulated by the substrate and the anode, it is possible to efficiently prevent external air or moisture from penetrating into the device.

Further, the present invention provides an illumination device including the organic light emitting diode. In the illumination device, the organic light emitting diode serves as a light emitting unit. Other configurations required for the illumination device which are known in the art may be applied.

Further, the present invention provides a display device including the organic light emitting diode. In the display device, the organic light emitting diode may serve as pixels or a backlight. Other configurations required for the display device which are known in the art may be applied.

Further, a method for preparing an organic light emitting diode according to another exemplary embodiment of the present invention includes sequentially forming an organic light emitting unit including a first electrode, an organic material layer, and a second electrode on a substrate; and encapsulating an outside of the organic light emitting unit by an encapsulation unit including a sealing layer contacting the outside of the organic light emitting unit, an insulating layer provided on the sealing layer, and a metal pattern layer provided between the sealing layer and the insulating layer.

A method for preparing an organic light emitting diode in the related art is schematically illustrated in FIG. 4, and a method for preparing an organic light emitting diode according to another exemplary embodiment of the present invention is schematically illustrated in FIG. 5.

Further, a method for preparing an organic light emitting diode according to another exemplary embodiment of the present invention includes forming two or more organic light emitting units including a first electrode, an organic material layer, and a second electrode on one substrate, forming two or more organic light emitting diodes including a substrate, an organic light emitting unit, and an encapsulation unit by simultaneously encapsulating the outsides of two or more organic light emitting units with an encapsulation unit; and dividing two or more organic light emitting diodes into individual organic light emitting diodes, in which the encapsulation unit includes a sealing layer contacting the outside of each of the two or more organic light emitting units, an insulating layer provided on the sealing layer, and a metal pattern layer provided between the sealing layer and the insulating layer.

In the present invention, the metal pattern layer may be formed by laminating a pre-cut metal pattern on the insulating layer or depositing the metal layer on the insulating layer and then patterning.

The metal pattern layer may include a first metal pattern which electrically connects the first electrode and the external power supply and a second metal pattern which electrically connects the second electrode and the external power supply.

The metal pattern layer includes a third metal pattern, and the third metal pattern may be provided on an emission area of the organic light emitting unit.

In the present invention, the metal pattern layer includes the first metal pattern, the second metal pattern, and the third metal pattern, the first metal pattern electrically connects the first electrode and the external power supply, the second metal pattern electrically connects the second electrode and the external power supply, the third metal pattern is provided on an emission area of the organic light emitting unit, and the first metal pattern, the second metal pattern, and the third metal pattern may be spaced apart from each other to be electrically short-circuited from each other.

Based on an upper plan view of the organic light emitting diode, the area of the third metal pattern may be the same as or larger than that of the emission area of the organic light emitting unit. Further, the third metal pattern may have a structure of encapsulating the upper portion and the side of the emission area of the organic light emitting unit.

In the present invention, the method may further include forming a contact hole that electrically connects the first electrode or the second electrode with the external power supply in the encapsulation unit. In the method for preparing the organic light emitting diode, the description for the substrate, the organic light emitting unit including the first electrode, the organic material layer, and the second electrode, and the encapsulation unit including the sealing layer, the insulating layer, and the metal pattern layer may be cited as described above.

An encapsulation member according to the exemplary embodiment of the present invention is an encapsulation member including a sealing layer, an insulating layer provided on the sealing layer, and a metal pattern layer provided between the sealing layer and the insulating layer, and the encapsulation member includes at least one contact hole penetrating in a thickness direction, and the encapsulation member includes a protective layer on at least one surface of an upper surface and a lower surface of the encapsulation member.

Further, the encapsulation member according to the exemplary embodiment of the present invention is an encapsulation member including a sealing layer, an insulating layer provided on the sealing layer, and a metal pattern layer provided between the sealing layer and the insulating layer, and includes protective layers included on the upper surface and the lower surface of the encapsulation member, and any one of the protective layers included on the upper surface and the lower surface of the encapsulation member, the insulating layer, the metal pattern layer, and the sealing layer are half-cut in the thickness direction.

Since the detailed contents for the sealing layer, the insulating layer, and the metal pattern layer, and the contact hole are the same as described above, the detailed description therefor is omitted.

The encapsulation member according to the exemplary embodiment of the present invention is schematically illustrated in FIG. 6.

The method for preparing the encapsulation member according to the exemplary embodiment of the present invention includes forming a first protective layer on one surface of the insulating layer, forming a metal pattern layer on the other surface of the insulating layer, forming a sealing layer on the entire surface of the insulating layer and the metal pattern layer, forming a second protective layer on the sealing layer, and forming at least one contact hole penetrating in a thickness direction of the insulating layer, the metal pattern layer, the sealing layer, and the second protective layer.

In the present invention, after the forming of the contact hole, the method may further include performing a half-cutting process in a thickness direction of the insulating layer, the metal pattern layer, the sealing layer, and the second protective layer.

In the present invention, the encapsulation member may be applied as the encapsulation member of the organic light emitting diode by a method of removing the second protective layer, aligning the position on the substrate and the organic light emitting unit, and laminating the encapsulation member. Thereafter, the first protective layer is removed, and an external power supply may be electrically connected with the first electrode or the second electrode through the contact hole.

The metal pattern layer may include two or more metal patterns which are spaced apart from each other to be electrically short-circuited from each other. In detail, when the encapsulation member is used as the sealing member of the organic light emitting unit of the organic light emitting diode, the encapsulation member may include a first metal pattern which electrically connects the first electrode of the organic light emitting diode and the external power supply and a second metal pattern which electrically connects the second electrode of the organic light emitting diode and the external power supply.

The organic light emitting diode according to the exemplary embodiment of the present invention uses the structure including the sealing layer, the insulating layer, and the metal pattern layer provided between the sealing layer and the insulating layer as the encapsulation unit, thereby simplifying a structure for the encapsulation of the organic light emitting unit and the equipotential of the electrodes.

The invention claimed is:

1. An organic light emitting diode, comprising:
   a substrate;
   an organic light emitting unit in which a first electrode, an organic material layer, and a second electrode are sequentially laminated on the substrate; and
   an encapsulation unit encapsulating an outside of the organic light emitting unit,
   wherein the encapsulation unit includes a sealing layer contacting the outside of the organic light emitting unit, an insulating layer provided on the sealing layer, and a metal pattern layer provided between the sealing layer and the insulating layer, and
   the metal pattern layer includes a first metal pattern which electrically connects the first electrode and an external power supply, and a second metal pattern which electrically connects the second electrode and the external power supply,
   wherein the first metal pattern and the second metal pattern are spaced apart and electrically isolated from each other.

2. The organic light emitting diode of claim 1, wherein the metal pattern layer includes a third metal pattern, and the third metal pattern is provided on an emission area of the organic light emitting unit.

3. The organic light emitting diode of claim 2, wherein based on an upper plan view of the organic light emitting diode, the area of the third metal pattern is the same as or larger than that of the emission area of the organic light emitting unit.

4. The organic light emitting diode of claim 2, wherein the third metal pattern seals the upper portion and the side of the emission area of the organic light emitting unit.

5. The organic light emitting diode of claim 2, wherein the first metal pattern and the second metal pattern, and the third metal pattern are spaced apart and electrically isolated from each other.

6. The organic light emitting diode of claim 1, wherein the encapsulation unit includes at least one contact hole penetrating in a thickness direction.

7. The organic light emitting diode of claim 6, wherein the contact hole is filled with a conductive material.

8. The organic light emitting diode of claim 7, wherein the conductive material includes at least one of a conductive paste including one or more kinds selected from Ag, Au, Cu, Ni, Al, W, Co, Pd, and an alloy thereof; a conductive polymer including one or more kinds selected from polyacetylene, polyaniline, doped polyethylene, polypyrrole, polythiophene, conductive epoxy, a mixture thereof, and a copolymer thereof; and a mixture formed by adding a conductive ball to the conductive polymer.

9. The organic light emitting diode of claim 1, wherein the sealing layer further includes a conductive ball which electrically connects the first electrode or the second electrode and the external power supply.

10. The organic light emitting diode of claim 1, further comprising:
    a first metal pad which is provided on an opposite surface to a surface with the metal pattern layer of the insulating layer and electrically connected with the first electrode.

11. The organic light emitting diode of claim 1, further comprising:
    a second metal pad which is provided on the opposite surface to a surface with the metal pattern layer of the insulating layer and electrically connected with the second electrode.

12. The organic light emitting diode of claim 1, wherein the insulating layer includes polyimide.

13. The organic light emitting diode of claim 1, wherein the organic light emitting diode is a flexible organic light emitting diode.

14. The organic light emitting diode of claim 1, wherein: the organic light emitting diode includes two or more organic light emitting units on the substrate, and the encapsulation unit includes two or more metal pattern layers provided between one sealing layer and one insulating layer.

15. An illumination device including the organic light emitting diode of claim 1.

16. A display device including the organic light emitting diode of claim 1.

17. A method for preparing an organic light emitting diode, comprising:
    forming an organic light emitting unit including a first electrode, an organic material layer, and a second electrode on a substrate in sequence; and
    encapsulating an outside of the organic light emitting unit by an encapsulation unit including a sealing layer contacting the outside of the organic light emitting unit, an insulating layer provided on the sealing layer, and a metal pattern layer provided between the sealing layer and the insulating layer,
    wherein the metal pattern layer includes a first metal pattern which electrically connects the first electrode and an external power supply, and a second metal pattern which electrically connects the second electrode and the external power supply, and
    wherein the first metal pattern and the second metal pattern are spaced apart and electrically isolated from each other.

18. The method of claim 17, wherein the metal pattern layer is formed by laminating a metal pattern on the insulating layer or depositing a metal layer on the insulating layer and then patterning.

19. The method of claim 17, further comprising:
    forming at least one contact hole penetrating in a thickness direction in the encapsulation unit.

20. A method for preparing an organic light emitting diode, comprising:
    forming two or more organic light emitting units including a first electrode, an organic material layer, and a second electrode on one substrate;
    forming two or more organic light emitting diodes including a substrate, an organic light emitting unit, and an encapsulation unit by simultaneously encapsulating the outsides of the two or more organic light emitting units by the encapsulation unit; and
    dividing the two or more organic light emitting diodes into individual organic light emitting diodes, wherein the encapsulation unit includes: a sealing layer contacting the outside of each of the two or more organic light emitting units; an insulating layer provided on the sealing layer;

and a metal pattern layer provided between the sealing layer and the insulating layer and including a first metal pattern which electrically connects the first electrode and an external power supply and a second metal pattern which electrically connects the second electrode and the external power supply, and wherein the first metal pattern and the second metal pattern are spaced apart and electrically isolated from each other.

21. An encapsulation member, comprising:

a sealing layer, an insulating layer provided on the sealing layer, and a metal pattern layer provided between the sealing layer and the insulating layer, wherein the encapsulation member includes at least one contact hole penetrating in a thickness direction, the encapsulation member includes a protective layer on at least one of an upper surface and a lower surface of the encapsulation member, and the metal pattern layer includes two or more metal patterns which are spaced apart and electrically isolated from each other.

22. An encapsulation member, comprising:

a sealing layer, an insulating layer provided on the sealing layer, and a metal pattern layer provided between the sealing layer and the insulating layer, wherein the encapsulation member includes protective layers provided on an upper surface and a lower surface of the encapsulation member, any one of the protective layers provided on the upper surface and the lower surface of the encapsulation member, the insulating layer, the metal pattern layer, and the sealing layer are half-cut in a thickness direction, and the metal pattern layer includes two or more metal patterns which are spaced apart and electrically isolated from each other.

23. A method for preparing an encapsulation member, comprising:

forming a first protective layer on one surface of an insulating layer and forming a metal pattern layer including two or more metal patterns which are spaced apart and electrically isolated from each other, on the other surface of the insulating layer;

forming a sealing layer on the entire surface of the insulating layer and the metal pattern layer;

forming a second protective layer on the sealing layer; and forming at least one contact hole penetrating in a thickness direction of the insulating layer, the metal pattern layer, the sealing layer, and the second protective layer.

24. The method of claim 23, further comprising:

after the forming of the contact hole, performing a half-cutting process in a thickness direction of the insulating layer, the metal pattern layer, the sealing layer, and the second protective layer.

\* \* \* \* \*